United States Patent [19]

Morris

[11] Patent Number: 5,393,348
[45] Date of Patent: Feb. 28, 1995

[54] APPARATUS FOR SPRAY COATING

[75] Inventor: Gilbert V. Morris, Amherst, N.H.

[73] Assignee: Teledyne Industries, Inc., Los Angeles, Calif.

[21] Appl. No.: 191,288

[22] Filed: Feb. 3, 1994

Related U.S. Application Data

[63] Continuation-in-part of Ser. No. 13,058, Feb. 3, 1993, Pat. No. 5,308,658.

[51] Int. Cl.⁶ .............................................. B05C 5/00
[52] U.S. Cl. .................................... 118/668; 118/314; 118/315; 118/316; 118/503; 118/677
[58] Field of Search ............... 118/668, 676, 677, 314, 118/315, 316, 500, 503; 269/229, 233, 287; 239/587.1, 536, 550, 566

[56] References Cited

U.S. PATENT DOCUMENTS

| | | | |
|---|---|---|---|
| 3,176,973 | 4/1965 | Daniels | 269/229 |
| 3,817,510 | 6/1974 | Jatcko | 269/233 |
| 3,885,066 | 5/1975 | Schwenninger | 118/315 |
| 4,261,707 | 4/1981 | Bradshaw et al. | 118/DIG. 7 |
| 4,451,000 | 5/1984 | Stephens | 228/20 |
| 4,535,722 | 8/1985 | Kondo | 118/315 |
| 4,607,590 | 8/1986 | Pender | 118/314 |
| 4,760,961 | 8/1988 | Nagai | 239/536 |
| 4,888,200 | 12/1989 | Milliken | 427/31 |
| 5,153,034 | 10/1992 | Telchuk et al. | 118/DIG. 7 |
| 5,165,969 | 11/1992 | Barlett et al. | 118/DIG. 7 |
| 5,169,132 | 12/1992 | Myers et al. | 269/233 |
| 5,248,094 | 9/1993 | Munoz | 239/550 |
| 5,265,800 | 11/1993 | Ziecker et al. | 239/587.1 |

FOREIGN PATENT DOCUMENTS

| | | | |
|---|---|---|---|
| 0192338 | 8/1986 | European Pat. Off. | 118/314 |
| 2926555 | 1/1981 | Germany | 118/503 |

*Primary Examiner*—W. Gary Jones
*Assistant Examiner*—Laura E. Edwards
*Attorney, Agent, or Firm*—Hayes, Soloway, Hennessey, Grossman & Hage

[57] ABSTRACT

Improved non-electrostatic spray coating process and apparatus are provided. The process and apparatus of the present invention permit significant reduction in over-spray conditions as well as, the disadvantages and drawbacks associated therewith, without causing corresponding reduction in coating efficiency.

15 Claims, 4 Drawing Sheets

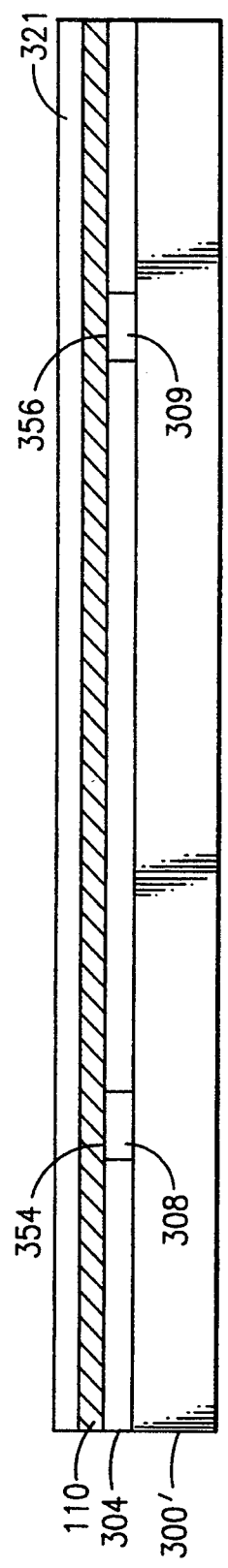
FIG.5A
FIG.5B
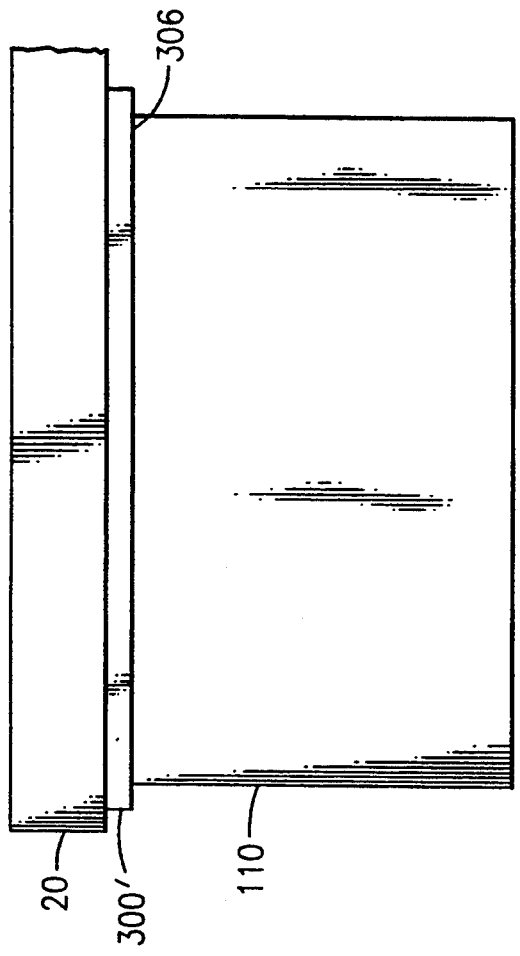
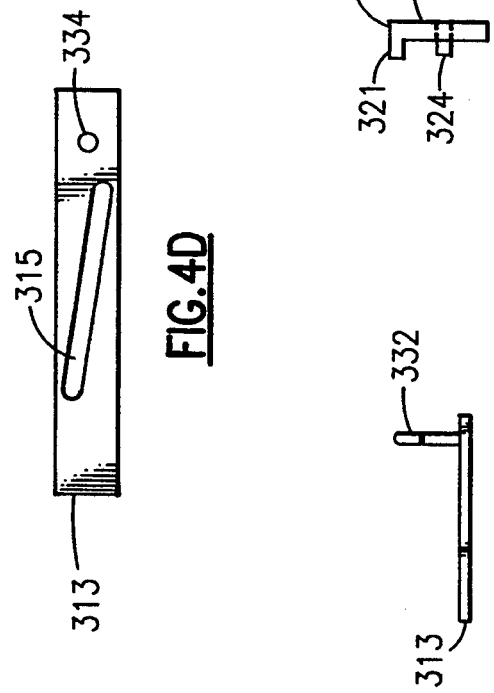
FIG.4D
FIG.4E
FIG.4F

APPARATUS FOR SPRAY COATING

BACKGROUND OF THE INVENTION

1. Field of the Invention

This application is a continuation-in-part of application Ser. No. 08/013,058, filed Feb. 3, 1993, now U.S. Pat. No. 5,308,658

The present invention relates to an improved apparatus for spray-coating workpieces, such as, printed circuit boards. The invention has particular utility in the area of spray-coating of printed circuit boards with photo-imageable resist material and will be described in connection with such utilities, although other utilities are contemplated by the present invention, e.g. spray-coating with other types of liquid materials.

2. Description of the Prior Art

In fabricating printed circuit boards, a uniform coating of liquid photo-imageable materials (and other materials) is routinely applied to the circuit board by, for example, roller coating, curtain coating, screen printing, electrostatic application, and so forth. In currently available workpiece spraying systems, over-spray is a problem, particularly in the case of automatic spray systems employing moving belts and the like. Over-spray typically collects on the moving belt, e.g., between the boards, along the belt sides, and even off the belt, in areas parallel to the belt. Over-spray is difficult to deal with and arrest. Over-spray drips from the coating chamber walls and from the belt, adding to materials cost and clean-up costs. Some of it may adhere to the belt, where it tends to accumulate in uneven layers. Over-spray conditions, if left uncorrected, can result in degradation of machine performance. Additionally, conventional methods of over-spray clean up typically generate hazardous waste, which presents another problem.

The prior art has proposed several methods for solving the problems associated with over-spray, the most successful of which will be presently detailed. One prior art method for coping with over-spray involves placing a sheet of paper or other similar pieces of laminar material under the work pieces during spraying. The paper catches the over-spray, and the spattered paper is retrieved and discarded. While the use of paper or the like reduces the problem of machine contamination by over-spray, the spray-contaminated paper presents its own hazardous waste disposal problem. Also, the use of paper or the like does not prevent over-spray, but merely minimizes certain problems resulting therefrom.

Another prior art solution is presented in Milliken, U.S. Pat. No. 4,888,200. Milliken discloses a process and apparatus for electrostatic spray-coating in which means for collecting over-spray and/or draining over-spray into the conductive belt is placed parallel to the spray zone. The collecting and draining means incline toward the belt, and a squeegee blade is positioned against the belt as the belt moves along its return-path (underneath the spray zone) to assist collection of over-spray which has collected on the belt. Just as before, although Milliken's disclosed process and apparatus attempt to mitigate the deleterious effects of over-spray in the spray-coating environment, they are not able to eliminate the source of the problem, namely, the over-spray condition itself. Additionally, electrostatic spray-coating presents a constant sparking hazard which, left unchecked, can result in ignition of the volatile chemicals commonly used in spraying.

Other prior art spray-coating apparatuses and processes are disclosed in Schwenninger, U.S. Pat. No. 3,885,066; Kondo, U.S. Pat. No. 4,535,722; and, Pender, U.S. Pat. No. 4,607,590, all of which suffer to some extent from the aforesaid (and other) problems associated with over-spray conditions.

OBJECTS OF THE INVENTION

It is therefore an object of the present invention to provide a spray-coating apparatus which eliminates the disadvantages and drawbacks of the prior art, without reduction in spraying efficiency, cost-effectiveness, and coating quality.

SUMMARY OF THE INVENTION

Accordingly, the present invention provides apparatus for non-electrostatic spray-coating of at least one surface of a workpiece. In accordance with the present invention, a work piece to be coated is conveyed in a travel path past a plurality of linearly configured, non-rotating, spraying means. The surface(s) of the workpiece to be coated are oriented substantially normal to the travel path. A liquid material is sprayed by the spraying means onto the workpiece. The spraying means are oriented so as to spray substantially normal to the travel path of the workpiece to be coated, and are displaced from the workpiece by a predetermined distance. The linearly configured spraying means are adapted to produce substantially identical elliptically-shaped spray patterns on the workpiece, each of which patterns has a major axis height, and which overlap each other with a predetermined overlap factor which preferably ranges between about 10% and 50%, and more preferably between 10% and 30% of the major-axis height of the spray patterns. The spraying means are activated and deactivated in response to the presence of the workpiece.

BRIEF DESCRIPTION OF THE DRAWINGS

For a fuller understanding of the objects of the present invention, reference should be had to the following Detailed Description taken in conjunction with the accompanying drawings, in which:

FIG. 4D is a top plan view of one cam for use in the preferred embodiment shown in FIGS. 4A–4C;

FIG. 4E is a side view of the cam of FIG. 4D;

FIG. 4F is a side view of jaw means for use in the preferred embodiment shown in FIGS. 4A–4C;

FIG. 5A is a simplified front view of the alternative holding means of FIGS. 4A–4C shown in conjunction with a transport shuttle and holding a circuit board; and FIG. 5B is the bottom view of FIG. 4C shown holding a circuit board.

While the present invention will be described in connection with preferred embodiments thereof, it will be understood by those skilled in the art that it is not intended to limit the invention to these embodiments. On the contrary, it is intended to cover all alternatives, modifications, and equivalents as may be included within the spirit and broad scope of the present invention as defined only by the claims.

DETAILED DESCRIPTION OF DETAILED EMBODIMENTS

Figure 1:
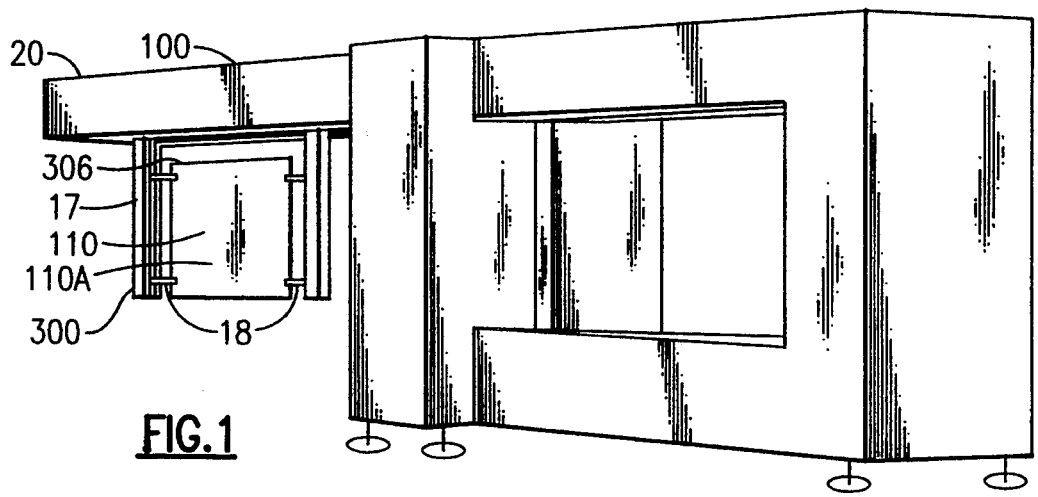
FIG. 1 is a simplified side-elevational view, illustrating an outside view of one preferred embodiment of a spray coating apparatus made according to the present invention.

FIG. 1 is a simplified side-elevational view of one preferred embodiment of a spray-coating apparatus according to the present invention. Depicted in FIG. 1 is a spraying apparatus 100 from which is supported and moves a workpiece 110 (which may be a rigid, semi-rigid or flexible flat-panel printed circuit board or a similar type of article) having two surfaces, at least one 110A of which is to be coated with a liquid material (e.g., photo-imageable solder mask materials and the like). Preferably, means 300 are provided for holding the workpiece 110 during conveyance through apparatus 100, which means 300 comprises gripper means 18 consisting of robotic, mechanical two-gripper arms of conventional construction, as shown in FIG. 1, for each of the panel 110. Any number of such gripper arms may be used in gripper means 18 without departing from this embodiment of the present invention. Preferably, gripper means 18 is connected to conventional carry arms 17 for permitting the sprayer transport shuttle 20 to convey the workpiece 110 through the apparatus 100.

Figure 3:
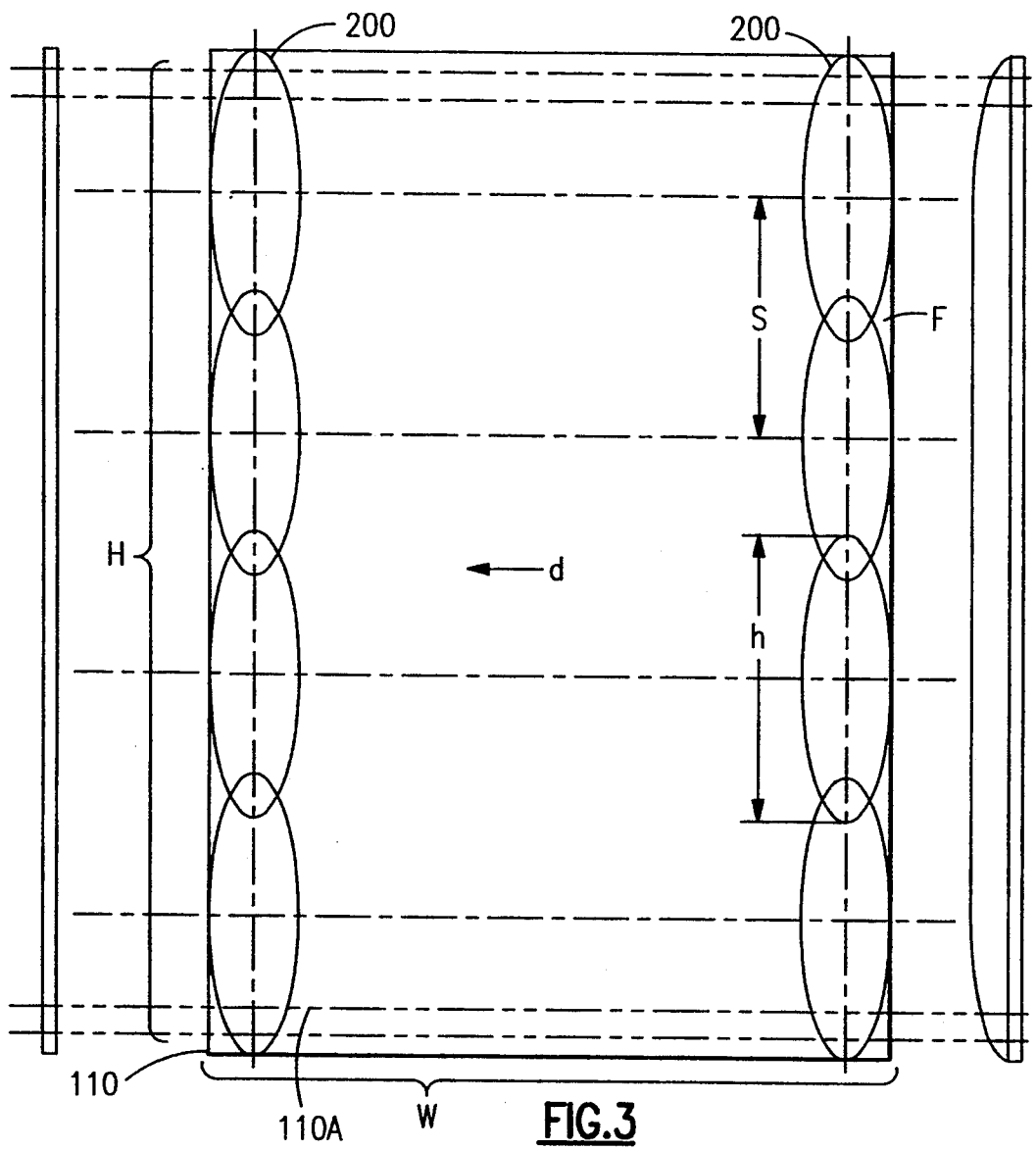
FIG. 3 is a simplified diagramatic illustration of a spray pattern produced by spraying means of the apparatuses depicted in FIGS. 1 and 2.
Figure 2:
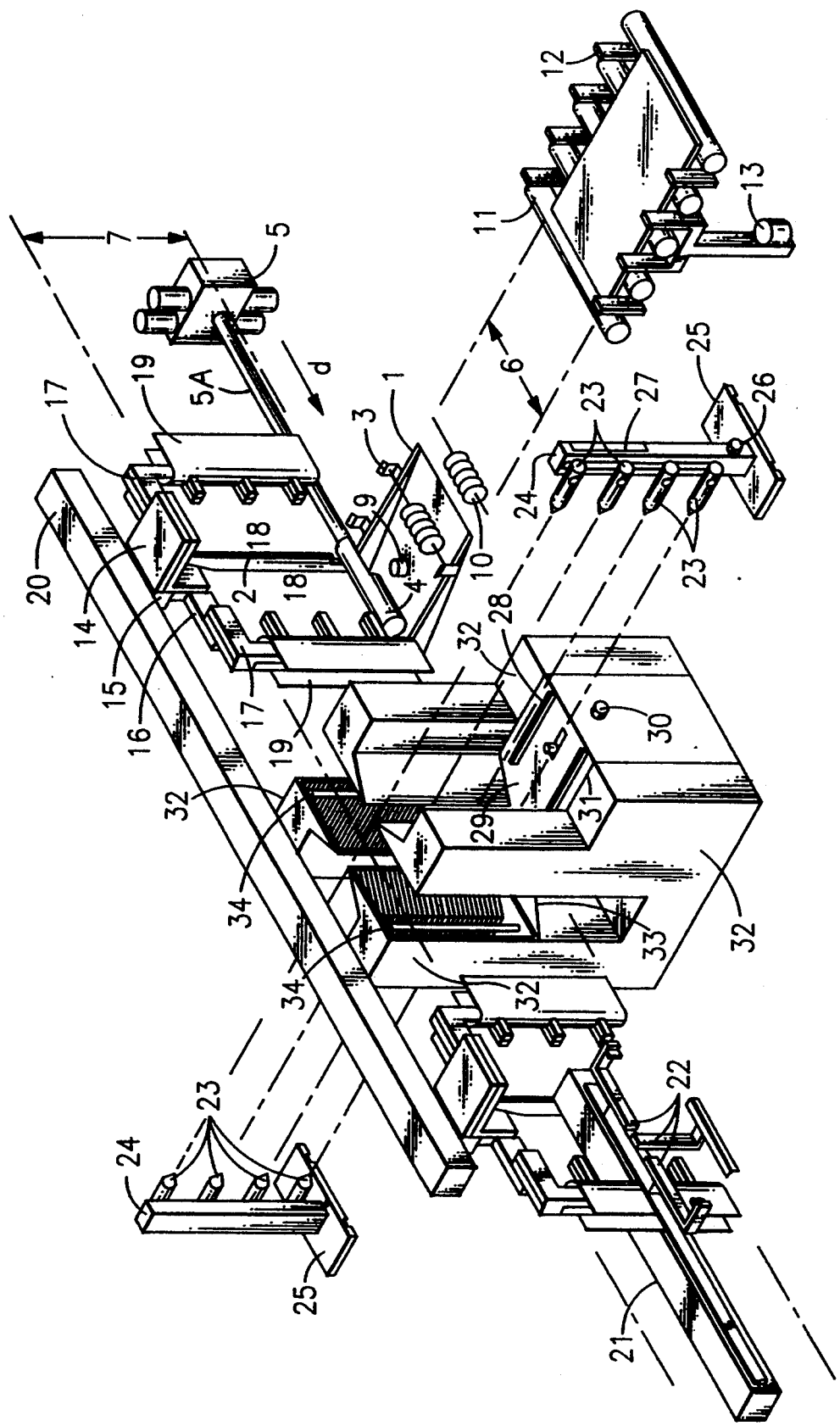
FIG. 2 is an exploded cut-away diagramatic representation of a variation of the preferred embodiment depicted in FIG. 1.
Figure 4A:
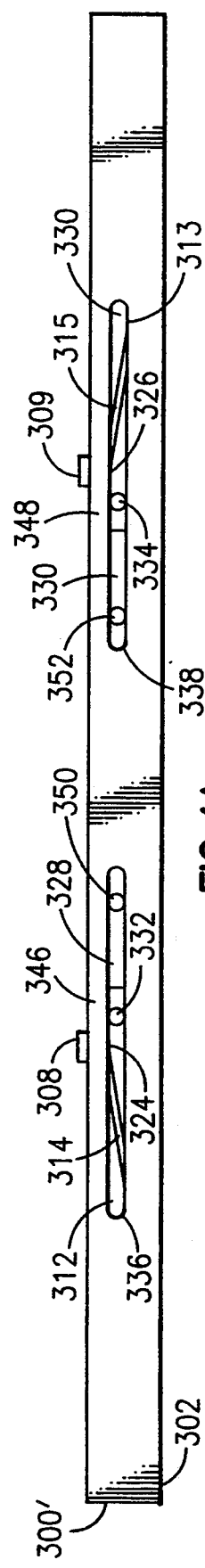
FIG. 4A is a top view of a preferred embodiment of an alternative means for holding a workpiece for use in conveying same through the apparatus of FIGS. 1 and 2.
Figure 4B:
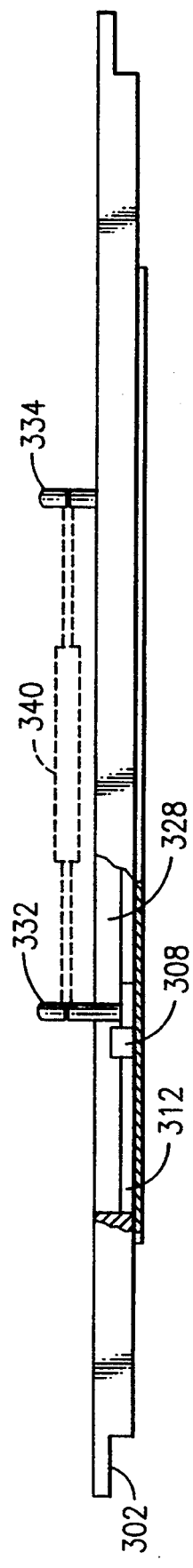
FIG. 4B is a side, partial cut-away view of the preferred embodiment shown in FIG. 4A.
Figure 4C:
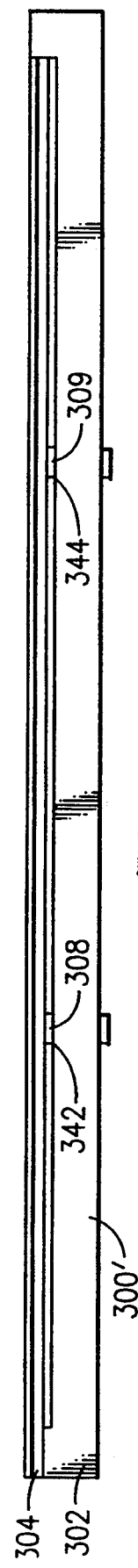
FIG. 4C is a bottom view of the preferred embodiment shown in FIGS. 4A and 4B.

Turning to FIGS. 2 and 3, at the start of the spray-coating process, workpiece 110 is preferably placed on roller-conveyors 11 between centering fingers 12. One or more conventional optical edge sensors 13 (or other suitable sensing means) verify that workpiece 110 is positioned exactly between (that is, equidistant from) fingers 12 so that it may be conveyed by positioning-conveyor 10 in entry plane 6 so as to enter the apparatus' swing arms 1. Once the presence of workpiece 110 between swing arms 1 is verified by panel presence sensor 9 swing arms 1 are swung up about shaft 5A by conventional rotary actuating means 5 so as to be positioned adjacent stationary arms 2, and serve as a backstop for swing arms 1. Optionally, swing arms 1 may include edge guides 3, 4 for permitting greater centering accuracy of the workpiece 110 between the swing arms 1 during loading thereof into apparatus 100. Of course, the panel 110 may also be placed within apparatus 100 by other means, e.g., conventional manual placement.

After swing arms 1 have been actuated to place workpiece 110 in transport plane 7 (which preferably, in this embodiment 100, is oriented substantially normal to entry plane 6 and thus is in an essentially vertical orientation), carry arms 17 and grippers 18 (which, at rest, are positioned in transport plane 7) are used to transport workpiece 110 in a travel path (indicated by arrow d) in travel plane 7 through spraying apparatus 100. First, carry arms 17 are spread apart to accommodate both the width W and thickness T of the workpiece 110. Preferably, the grippers 18 and carry arms 17 are adjustably mounted on frame 15 and actuable to permit accommodation of various dimensions of the workpiece 110. Additionally, and also, preferably, the number of, and distance between, the gripper arms of gripper means 18 is adjusted to permit grippers 18 to optimally carry various workpiece heights H. As shown in FIG. 2, three grippers 18 per panel edge are used to hold and carry workpiece 110 during its conveyance through apparatus 100. Preferably, spray shields 19 are placed over carry arms 17 to protect the carry arms 17 from over-spraying. Preferably, shields 19 are easily removable from grippers 18 and transport arms 17, are made of lightweight metal and/or plastic material, so that they may be disposed of after use. Once panel 110 is positioned between grippers 18 and transport arms 17, transport arms 17 are actuated by conventional motive means (not shown) to allow grippers 18 to move into position so as to hold workpiece 110 in travel plane 7. Preferably, the number of grippers used, the gripping tension force, and the compression force between arms 17, are adjusted to create a slight curvature (not shown) along a vertical axis of the workpiece 110 so that the workpiece 110 is held tensioned between arms 17 by grippers 18, which lightly engage the edges of workpiece 110, so as to prevent surface damage which might be caused by application of too much clamping force by clamping means 18. This edge-tensioning approach is especially advantageous when used to hold thin, flexible panels.

Once the panel 110 is held tensioned between arms 17, conveyor means (not shown) of conventional construction (e.g., an endless belt or other type of suitable conveyor means) is used to transport board 110 at a predetermined velocity V in the travel path d in plane 7 through apparatus 100 and adjacent spraying means or guns 23. Non-rotating (that is, non-oscillating) spray guns 23 are linearly mounted in a vertical orientation on adjustable spacer frame 24. Frame 24 is mounted on adjustable gun carriage 25. Spray guns 23 are of conventional construction and are designed to deliver high-efficiency low-pressure spray of a liquid solder mask material to at least one surface 110A of the board 110. Preferably, as is shown in FIG. 2, spray guns 23 are positioned on both sides of board 110 so as to be able to simultaneously deliver the spray of photo-imageable materials to both sides of board 110. Preferably, spray guns 23 are of the type sold by Graco, Inc. of Minneapolis, Minn., Model HELP1600 or Model 210-744 Series C, which are described in Graco, Inc. Publication Nos. 308-044, Revision D and 307-237, Revision J, respectively. However, other types of spray guns may be used.

Gun spacers 24 may comprise conventional means for changeably fixing the guns 23 to the carriages 25 in a desired orientation and spacial relationships with each other. Preferably, carriages 25 are slidably mounted on conventional guide rails 28 upon platform 29, in order to permit spacing distance D adjustments (that is, adjustment of the distance D between nozzles 23 and surface 110A), either manually or by use of automatic actuators 26. Actuator means 26 (which preferrably comprises conventional motive means or the like) may be preset so that upon selection of a desired, predetermined spacing distance, that distance may be automatically realized by actuating means 26. Also preferably, indicating means 27 (comprising, e.g., conventional graphical, digital display, and/or distance sensing means) is used to indicate spacing between nozzles 23. Preferably, spacing among the nozzles of spraying means 23 themselves is identical and is chosen so as to satisfy a first relationship $S = H/N$, wherein H is the height of the workpiece and N is the number of nozzles on each side of the workpiece.

The distance D between nozzles 23 and workpiece surface 110A is preferably kept small and is made to be approximately the spacing distance S between nozzles 23. Guns 23 are preferably connected to conventional liquid and air supply means (not shown). The liquid supply means comprises a reservoir, pumping means, pressure regulation means, and on/off control. The air supply means comprises two separate compressed air supply means, each of which has a compressed air line, a separate pressure regulator, and on/off control. One air supply is used for atomization of liquid and provides atomization air for this purpose at pressure $P_A$. The second air supply is used for shaping the atomized liquid and supplies shaping air identified as for this purpose at pressure $P_s$. Preferably, atomizing air pressure Pa is adjusted so as to be the minimum value necessary for adequate atomization of the liquid. Preferably, the ratio R of shaping air pressure Ps to atomizing air pressure $P_A$ for each gun is made substantially equal to $H/P_L$, wherein $P_L$ is the liquid supply pressure to each gun. Preferably, liquid supply pressure to each gun is independently controllable and is separately adjustable to compensate for each gun's respective elevation on spacer 24. In other words, each gun's liquid supply pressure is separately adjusted so that, despite the differing elevations of each gun on spacer 24, the nozzle pressures of the guns are substantially identical. According to one aspect of the present invention, spray distance D between the spray means 23 and the workpiece 110, and the means 23 themselves, are adapted to produce substantially identical, elliptically-shaped spray patterns 200 (as illustrated in FIG. 3) on workpiece 110. These elliptically-shaped spray patterns 200 have a major axis height h and overlap each other with an overlap factor F chosen so as to be within a range of between 10% and 30% of the spray pattern's major axis height. Advantageously, it has been found that by overlapping the elliptical spray patterns 200 formed by the spraying means 23 within the aforesaid range, overspray conditions may be minimized. In a preferred embodiment of the present invention, the spray means 23 are spaced from one another by a spacing distance S substantially equal to $(1-F)h$. Also, preferably, so as to further minimize over-spray, the flow rate:Q at which the spray means 23 sprays the surface 110A of the workpiece 110 is made to substantially satisfy a further relationship, $Q=N(1-F)hVT$, wherein T is the thickness to which the workpiece is desired to be coated with the liquid material.

Returning to FIG. 2, the spraying means 23 preferably are oriented so as to spray substantially normal to the travel path d and to surface 110A of the workpiece 110 to be coated. However, the spraying means alternatively may be oriented to spray the workpiece at an angle A relative thereto. In such a case, the flow rate Q of the spray means 23 preferably will be made to substantially satisfy the relationship, $Q=2NVTD(1-F)\tan(A)$.

Also preferably, a slight linear or angular offset is effected among the individual spraying means. Advantageously, this permits reduction in the interplay that ordinarily occurs between the shaping air flows of the guns 23. When the guns are so offset, the firing of the spray guns is coordinated with the motion of the board so as to permit the spray patterns to be linearly disposed along the board.

Preferably, spraying of the side (or sides) of the workpiece begins substantially immediately when the leading edge of the workpiece enters in between the spraying means 23, and terminates substantially immediately when the trailing edge of the workpiece passes between the spraying means 23. Determination of the location of the workpiece relative to the spraying means 23 is accomplished, preferably, by means of a conventional digital displacement encoder (not shown); however, other sensing means may be used without departing from the present invention.

In a preferred embodiment of the present invention, an edge mask 33 is provided within the spray station 34A to control over-spray. Edge mask 33 preferably comprises an angled metallic or plastic shield, preferably made of a material which is non-wettable by the liquid coating, for blocking liquid coating from the lower edge area of the surface 110A panel 110. Liquid spray striking the mask 33 is diverted into a collection area therebeneath (not shown).

Also preferably provided within the exhaust housing 32 are exhaust boosters 34. Exhaust boosters 34 preferably comprise air knives appropriately shaped to utilize the Coanda Effect (described, in detail in U.S. Pat. No. 4,451,000 issued to Stephens) to recirculate air within the exhaust housing 32 to reduce the volume of exhaust air required to remove vapors while spraying. Preferably, for example, a small amount of compressed air at very high pressure may be discharged from each airknife orifice. Each knife orifice preferably extends the full length of the knife and is of very small area. According to the Coanda Effect, air discharged from the knives is diverted 90° (as a result of the knives' shape) and draws a disproportionately large amount of ambient air along with it. Preferably the air knives are activated slightly before and after, activation and deactivation respectively, of the spraying means 23, so as to boost instantaneous air exhaust during spraying.

Panels thus sprayed with the liquid material then exit the exhaust housing 32 whence they may be transported by, for example, a conventional overhead conveyor (not shown) to a separate location (also not shown) for further processing.

Turning now to FIGS. 4A-5B, a variant 300' of holding means 300 comprises a housing 302 preferably made of metal and/or a rigid plastic, and includes a channel or slot 304. Slot 304 has a size and shape to accommodate the top edge portion 306 of workpiece 110. At least one 308, and preferably two jaw means 308, 309 are included in means 300' for clamping upon and holding edge 306 of workpiece 110 in place in slot 304.

As shown in FIG. 4F, preferably, at least one jaw means 308 comprises an L-shaped member 320 having upstanding end section 321 for contacting the top portion 306 of workpiece 110, and a guide pin 324 for slidably mounting the jaw means in a diagonally oriented slot 304 of cam 312. Rectilinear cams 312, 313 are slidably mounted in respective channels 328,330 of housing 302 and are attached to respective actuating arms 332, 334 which extend out of housing 302 through openings 336, 338.

In use, actuating arms are slid so as to open jaw means 308, 309 accommodate an edge 306 of the workpiece 110. Edge 306 is then loaded into slot 304 by manual or automatic or robotic means. Arms 332,334 are then slid or moved from open 346, 348 position to closed or locked position 350,352. Movement may be accomplished manually, but preferably is accomplished, for example, by means of a pressure cylinder or the like, shown in phantom at 340. Movement of arms 332,334 from open to closed position causes cams 312, 313 to slide in channels 328, 330, which in turn causes jaws means 308, 309 to move from an open 342, 344 position to a closed or locking position 354, 356. In the locking position, jaw means 308, 309 extend outwardly from the hollows into slot 304 and impinge upon workpiece 110, forcing the workpiece against back rail 321 and clamping the workpiece therebetween. Thus, in the locking position, jaw means 308,309 clamp workpiece 110 against the back rail 321 of slot 304 and hold the workpiece therein by its edge 306, for transport through the spray coating apparatus.

It is evident therefore that there has been provided, in accordance with the present invention, an improved non-electrostatic spray-coating process and apparatus. While the invention has been described in connection with specific embodiments and methods of use, various alternatives, modifications, and variations may be made without departing from the spirit and scope of the present invention. For example, although four high-volume low-pressure spraying means are preferably used to spray the panel, any number of such spraying means may be used.

For example, the gripping and holding mechanism illustrated in FIGS. 4A-4F, 5A and 5B advantageously may be used for gripping and holding other types of workpieces of a variety of shapes and sizes, for transportation through other industrial applications, e.g., through subsequent drying processing in a conventional drying oven. Accordingly, the present invention is intended to embrace all such alternatives, modifications, and variations as may fall within the spirit and broad scope of the hereinafter appended claims.

I claim:

1. An apparatus for spray coating at least one surface of a workpiece having a height H, said apparatus comprising:
   a. a plurality of vertically-oriented, linearly-configured spray means of number N for spraying with a liquid material said surface;
   b. means for conveying said workpiece in a travel path at a velocity V past said spray means, said spray means producing substantially identical elliptically-shaped spray patterns, each said elliptically-shaped pattern having a major axis height h, said spray means including adjustable means for spacing said spray means so that said patterns overlap each other with an overlap factor F within a range of between 10 and 50 percent of said major axis height;
   c. means for determining the position of said workpiece relative to said spray means; and
   d. means for activating said spray means to spray only when a workpiece is in a target position in said travel path.

2. An apparatus according to claim 1, wherein said spacing means is adjusted so that said spray means are spaced from each other a spacing distance S equal to H/N.

3. An apparatus according to claim 1, and including two banks of linearly configured spray means facing one another on opposite sides of said travel path.

4. An apparatus according to claim 1, and further comprising an exhaust housing having a plurality of exhaust boosters positioned adjacent said spray means.

5. An apparatus according to claim 1, wherein said spacing means is adjusted so that said spray means are spaced from each other by a spacing distance S substantially equal to $(1-F)h$.

6. An apparatus according to claim 1, wherein said spray means comprise means for forming said spray patterns at least partially by flow of atomizing and shaping air in said spray means.

7. An apparatus according to claim 6, wherein said forming means is adapted to flow said atomizing and shaping air at respective pressures $P_F$ and $P_A$, and said spray means comprise means for supplying said liquid at a pressure $P_L$, and $P_F$ divided by $P_A$ substantially equals $h/P_L$.

8. An apparatus according to claim 1, wherein said spacing means is adapted to permit said spray means to spray said workpiece at an angle A relative thereto, to a thickness T, at a distance D therefrom, and at a flow rate Q that is substantially equal to $2NVTD(1-F)\tan(A)$.

9. An apparatus according to claim 1, wherein said conveying means includes means for holding said workpiece during conveyance past said spray means, said holding means comprising:
   i. a housing having a slot dimensioned for accommodating an edge of said workpiece;
   ii. at least one jaw for bearing upon and locking said edge in said slot, said jaw being actuatable between an open and a closed position, said open position permitting insertion of said edge into said slot and said closed position locking said edge in said slot.

10. An apparatus according to claim 9, wherein said holding means further comprises a cam located in said housing said jaw being actuated between said open and closed positions by said cam, said cam being actuated by at least one arm mounted to said cam through an opening in said housing.

11. Apparatus according to claim 10, and including hydraulic means operatively connected to said cam for actuating said cam through said at least one arm.

12. Apparatus for holding a workpiece, and comprising:
   a. a housing having a slot dimensioned for insertion therein of an edge of said workpiece;
   b. at least one jaw means in said housing for bearing upon and locking said edge in said slot, said jaw means being actuable between an open and a closed position, said open position permitting insertion of said edge into said slot and said closed position locking said edge in said slot;
   c. a cam located in said housing for actuating said jaw between said open and closed positions, said cam being actuated by at least one arm mounted to said cam through an opening in said housing.

13. Apparatus according to claim 12, and including hydraulic means operatively connected to said cam for actuating said cam through said at least one arm.

14. An apparatus according to claim 1, wherein F is between 10 and 30 percent of said major axis height.

15. An apparatus according to claim 1, wherein F is between 30 and 50 percent of said major axis height.

* * * * *